(12) United States Patent
Chiueh et al.

(10) Patent No.: US 9,229,510 B2
(45) Date of Patent: Jan. 5, 2016

(54) POWER MANAGEMENT METHOD FOR ELECTRO-CHEMICAL BATTERIES IN LOW CAPACITY STATE

(71) Applicant: INDUSTRIAL TECHNOLOGY RESEARCH INSTITUTE, Hsinchu (TW)

(72) Inventors: Tzi-Cker Chiueh, Taipei (TW); Chia-Ming Chang, Hsinchu County (TW); Shou-Hung Ling, Taipei (TW); Shih-Hao Liang, New Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 233 days.

(21) Appl. No.: 14/174,472

(22) Filed: Feb. 6, 2014

(65) Prior Publication Data

US 2014/0157034 A1 Jun. 5, 2014

Related U.S. Application Data

(63) Continuation-in-part of application No. 13/081,514, filed on Apr. 7, 2011, now Pat. No. 8,823,325.

(60) Provisional application No. 61/909,228, filed on Nov. 26, 2013.

(30) Foreign Application Priority Data

Nov. 25, 2010 (TW) .................................. 99140824

(51) Int. Cl.
*H02J 7/00* (2006.01)
*G06F 1/26* (2006.01)
(Continued)

(52) U.S. Cl.
CPC ................. *G06F 1/26* (2013.01); *H01M 10/42* (2013.01); *G01R 31/362* (2013.01); *G01R 31/3651* (2013.01)

(58) Field of Classification Search
CPC . H01M 10/42; G01R 31/362; G01R 31/3651; G06F 1/26

USPC ................. 320/132, 134, 136, 157, 163, 164; 324/427
See application file for complete search history.

(56) References Cited

U.S. PATENT DOCUMENTS 5,672,951 A * 9/1997 Shiota .................. G01R 31/361
320/132
7,389,439 B2 6/2008 Yoon et al.
(Continued)

FOREIGN PATENT DOCUMENTS

| CN | 101782803 A | 7/2010 |
|---|---|---|
| CN | 103078390 A | 5/2013 |

(Continued)

OTHER PUBLICATIONS

T.L. Martin et.al, "A case study of a system-level approach to power-aware computing," ACM Transactions on Embedded Computing Systems, vol. 2, No. 3, pp. 255-276, 2003.
(Continued)

*Primary Examiner* — Edward Tso
*Assistant Examiner* — Aaron Piggush
(74) *Attorney, Agent, or Firm* — Rabin & Berdo, P.C.

(57) ABSTRACT

A power management method for electro-chemical batteries in low capacity state is provided, including: obtaining battery information based on device hardware, to know in advance the maximum allowable current and maximum allowable power when the battery power is low; by detecting the changes in the voltage versus current, updating BCC curve; using BCC curve as power budget to control the ON/OFF of device function thread; and determining whether the minimum battery capacity and the control restriction are reached, and when the minimum battery capacity and the control restriction are reached, turn off the battery through normal shutdown process; otherwise, return to the step of obtaining battery information.

14 Claims, 14 Drawing Sheets

(51) Int. Cl.
*H01M 10/42* (2006.01)
*G01R 31/36* (2006.01)

(56) References Cited

U.S. PATENT DOCUMENTS

| | | | |
|---|---|---|---|
| 7,598,702 | B2 | 10/2009 | Walrath |
| 7,679,328 | B2 * | 3/2010 | Mizuno ............... G01R 31/361 320/132 |
| 7,839,121 | B2 | 11/2010 | Kim |
| 7,940,027 | B2 | 5/2011 | Desprez et al. |
| 8,001,400 | B2 | 8/2011 | Fadell |
| 8,080,976 | B2 | 12/2011 | Manor et al. |
| 8,106,630 | B2 | 1/2012 | Tupman et al. |
| 8,135,443 | B2 | 3/2012 | Aleksic et al. |
| 8,151,122 | B1 | 4/2012 | Ranganathan et al. |
| 8,250,384 | B2 | 8/2012 | Borghetti et al. |
| 8,307,224 | B2 | 11/2012 | Conroy et al. |
| 2012/0133331 | A1 | 5/2012 | Ling et al. |

FOREIGN PATENT DOCUMENTS

| | | | |
|---|---|---|---|
| EP | 1876669 | A1 | 1/2008 |
| TW | I260133 | B | 8/2006 |
| TW | 201221986 | A | 6/2012 |
| TW | 201301716 | A | 1/2013 |

OTHER PUBLICATIONS

Paul J.M. Havinga, and Gerard J.M. Smit, "Design techniques for low-power systems," Journal of Systems Architecture, vol. 46, pp. 1-21, 2000.

A. Rahmati and L. Zhong, "Human-battery interaction on mobile phones," Pervasive and Mobile Computing, vol. 5, pp. 465-477, 2009.

J.H. Min, H. Cha, and R. Ha, "System-level integrated power management for handheld systems," Microprocessors and Microsystems, vol. 33, pp. 201-210, 2009.

T.L. Martin and D.P. Siewiorek, "Nonideal battery and main memory effects on CPU speed-setting for low power," IEEE Transactions on very Large Scale Integration (VLSI) Systems, vol. 9, No. 1, pp. 29-34, 2001.

Taiwan Patent Office, Office Action, Patent Application Serial No. TW103113229, Jul. 22, 2015, Taiwan.

* cited by examiner

POWER MANAGEMENT METHOD FOR ELECTRO-CHEMICAL BATTERIES IN LOW CAPACITY STATE

CROSS-REFERENCE TO RELATED APPLICATION

This is a continuation-in-part (CIP) application of U.S. application Ser. No. 13/081,514, filed Apr. 7, 2011. The U.S. application Ser. No. 13/081,514 now is U.S. Publication No. 2012/0133331, which also claims the benefit of Taiwan Application Serial No. 99140824, filed Nov. 25, 2010. The CIP application is based on, and claims priorities from, U.S. application Ser. No. 13/081,514 and Taiwan Application Serial No. 99140824, the disclosure of which is incorporated by reference herein in its entirety. The CIP application is also based on, and claims priority from, U.S. Provisional Application No. 61/909,228 filed on Nov. 26, 2013, the disclosure of which is hereby incorporated by reference herein in its entirety.

TECHNICAL FIELD

The technical field generally relates to a power management method for electro-chemical batteries in low capacity state.

BACKGROUND

Even with all the advances of nowadays portable Information and Communications Technology (ICT) devices, such as, smart phone, tablet computer, system crash due to sudden power cut-off when the battery capacity is low is not uncommon. The main reason for such power cut-off can be explained as follows: the "polarization loss" and associated "impedance" of a Li-ion battery will become very high when the State of Charge (SoC) runs low. The same power fluctuations/surges resulted from running different programs and functions in an ICT device will cause bigger voltage fluctuations at low battery SoC stage. Battery low voltage protection will be activated to cut off the power when a voltage fluctuation reaches the lower voltage threshold. Such low SoC voltage fluctuation will be even bigger for an aged battery due to its impedance increase, and also results in the reduction of precaution lead time for an ICT system to make properly data save and system turn-off. Most of existing power management methods are based on electric/electronics considerations, while battery characteristic curve (BCC) is based on the electrochemical characteristics of a battery shown in FIG. 1. BCC transforms the electrochemical characteristics to a popular electronics control domain (Potential-Capacity domain) which enables a quantitative and simple control algorithm. BCC is particularly useful in the low SoC state when the concentration polarization loss is high.

A known problem of the contemporary batteries for electronic devices in low capacity state is that a power surge may occur during the operation to cause the system to shutdown before using up the remaining power in the batteries in low capacity state. The current power management technique it to restrict the user from using functions that consumes a large amount of power in order to prolong the use time of the electronic device when the battery is low. However, the imposed restriction in the power manage technique may cause great inconvenience because the user often intends to use functions that consume more power, such as, making phone calls, sending e-mail with attachments, and so on. At the point of peak power consumption, a battery in low capacity state may reaches the threshold defined for the minimum safe voltage, which will force the battery protection circuit to cut off the battery circuit and shutdown the system without warning when no other effective management is adopted. The observation shows that the peak power consumption often occurs when a function is started for execution, and therefore, the starting of execution of an important function often leads to a premature power shutdown when the peak power consumption exceeds the safety threshold. As a result, the remaining battery capacity is not appropriately utilized even when the remaining power may be sufficient to keep the system operating some important functions for a little longer.

SUMMARY

A method detecting the threshold when the polarization loss starts to significantly increase is provided. Such a method is also adaptive to battery aging.

The present disclosure may provide a power management method for electro-chemical batteries in low capacity state. The power management method is based on the BCC which reflects the border line before significant increase of battery polarization at low capacity state. The power management method also provides adaptive means as the battery ages, and is applicable to any devices driven by battery, such as, electrical cars, 3C devices, and so on. By controlling the power consumption of each function component in the device, the power management method might terminate some function threads and start (or keep) some function threads.

One exemplary embodiment relates to a power management method for electro-chemical batteries in low capacity state, comprising: obtaining battery information based on device hardware, to know in advance the maximum allowable current and maximum allowable power when the battery power is low; by detecting the changes in the voltage versus current, updating BCC curve; using BCC curve as power budget to control the ON/OFF of device function thread; and determining whether the minimum battery capacity and the control restriction are reached, and when the minimum battery capacity and the control restriction are reached, turn off the battery through normal shutdown process; otherwise, return to the step of obtaining battery information.

According to another one of the embodiments of the present disclosure, there is provided a non-transitory computer readable recording medium for storing one or more programs, the one or more programs causing a processing unit to perform the methods described herein.

According to another one of the embodiments of the present disclosure, there is provided an apparatus for power management, comprising a processing unit, and memory. The processing unit is configured to perform the steps described in the above embodiments.

According to another one of the embodiments of the present disclosure, there is provided a chip for power management, comprising one or more integrated circuits, the one or more integrated circuits being configured to process the function described in the above embodiments.

With the aforementioned power management method, the disclosed exemplary embodiments may use the BCC for dynamic current/power budget to more precisely control the electronic device power consumption; automatically detect and update BCC; and use a novel algorithm to modulate the total discharge current, where three types of power (peak power, occasional surge power, offset power) are defined and used as the basis for this algorithm. This algorithm is tolerant to the maximum power peaks which are often the calculation basis adopted by other power management algorithm.

DETAILED DESCRIPTION OF THE DISCLOSED EMBODIMENTS

Figure 1:
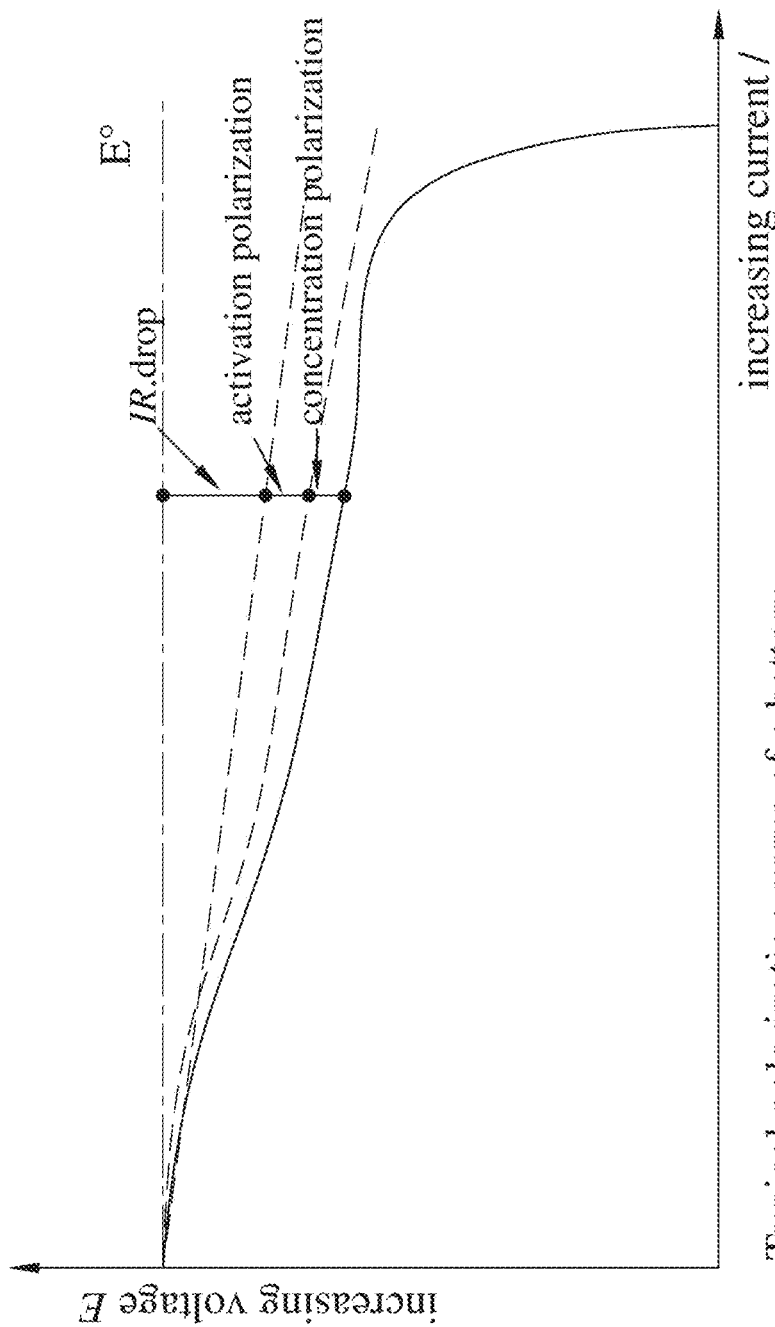
FIG. 1 shows a schematic view of a typical polarization curve, including IR drop, activation polarization, and concentration polarization of a battery.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 2:
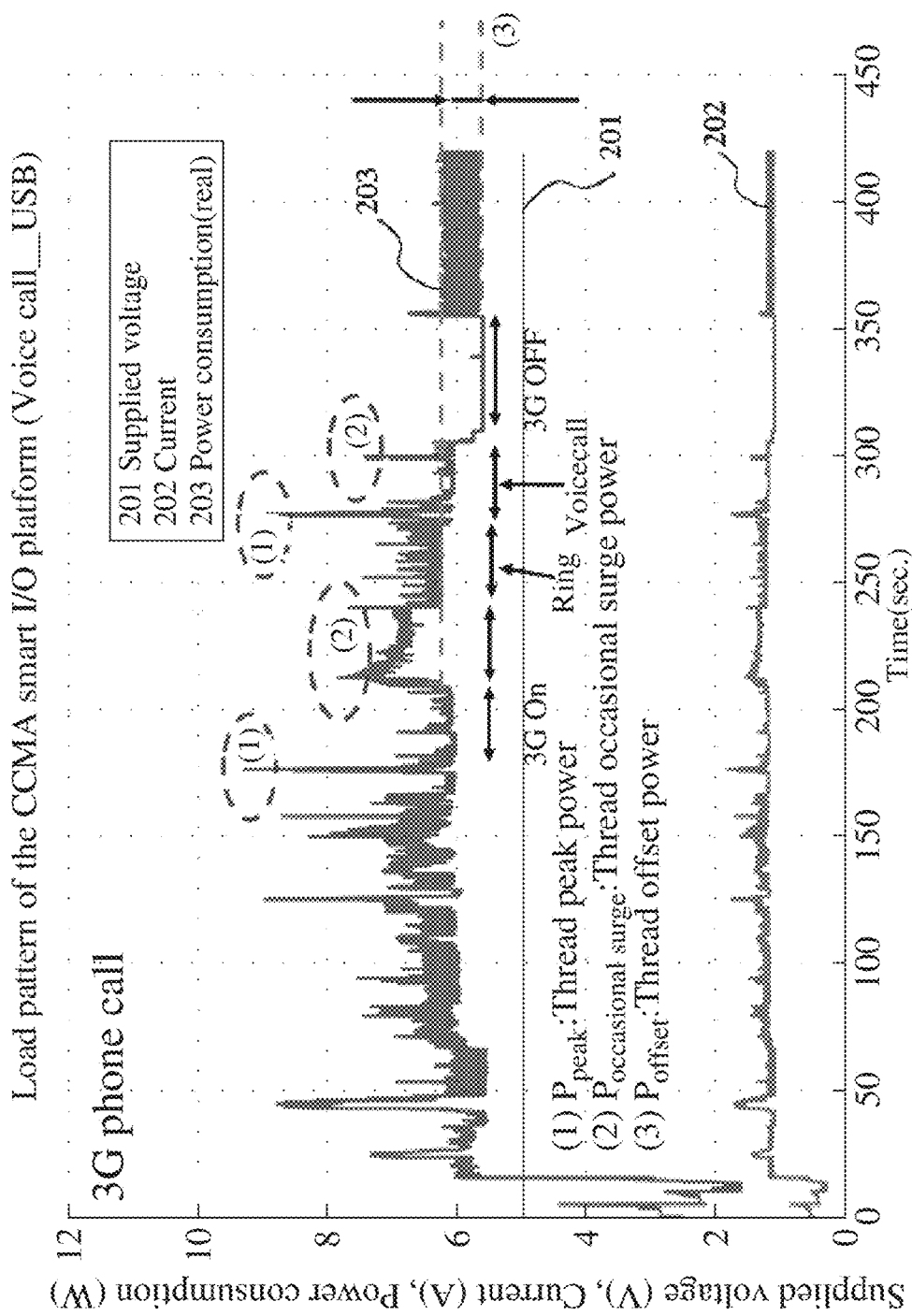
FIG. 2 shows a schematic view of power consumption in an actual scenario where a power surge occurs when making a 3G phone call, according to one exemplary embodiment.

FIG. 2 shows a schematic view of power consumption in an actual scenario where a power surge occurs when making a 3G phone call. As shown in FIG. 2, there are three measured parameters represented by supplied voltage 201, current 202, and power consumption 203; $P_{peak}$ represents the function thread peak power, which is the power peak associated with the highest power usage during a function thread execution, as given by the (1); $P_{occasional\ surge\ power}$ represents the power associated with the occasional peaks during a function thread execution, as given by the (2); and $P_{offset\ power}$ refers to the power offset when a function thread is closed (turned-off), depicted as (3) in FIG. 2. The function thread peak power often occurs at the beginning when a function thread is started. The function thread occasional peaks often occur once in a while during a function thread execution. Such power surge peaks are higher than nominal power but with much shorter duration. The offset power can be considered as the additional power allowance when a function thread is closed. Such allowance power amount can then be made available for other function threads to use.

Figure 3:
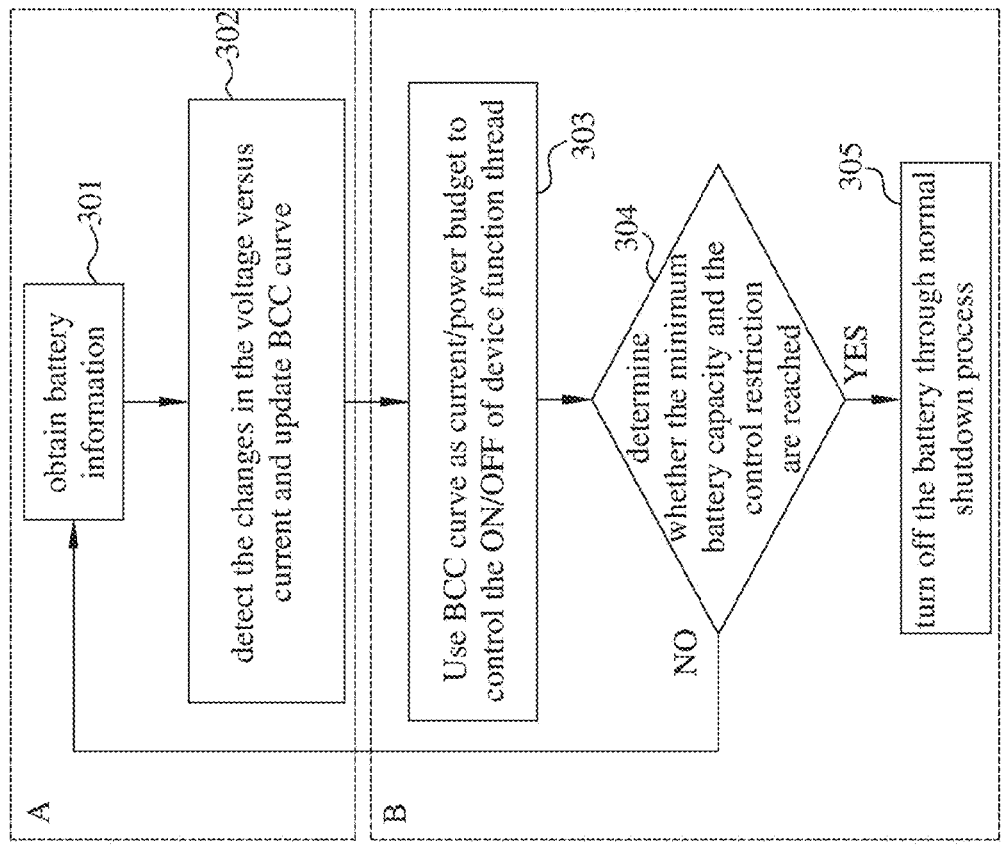
FIG. 3 shows a flowchart of a power management method for electro-batteries in low capacity state, according to one exemplary embodiment.

FIG. 3 shows a flowchart of a power management method for electro-batteries in low capacity state. As shown in FIG. 3, step 301 is to obtain battery information based on device hardware, to know in advance the maximum allowable current and maximum allowable power when the battery power is low. Step 302 is to detect the changes in the voltage versus current and update BCC curve. Step 303 is to use BCC curve as power budget to control the ON/OFF of device function thread. Step 304 is to determine whether the minimum battery capacity and the control restriction are reached, and when the minimum battery capacity and the control restriction are reached, turn off the battery through normal shutdown process, as shown in step 305; otherwise, return to the step 301 of obtaining battery information.

It should be noted that, in step 302, the updating of the BCC curve is executed regardless of the battery condition, in other words, aged battery, or replacing aged battery with new battery, and so on. Also, three types of power related index are defined for the power consumption of each function component, i.e., execution function thread, in the device so that the device can control the hardware to execute the important function thread based on the maximum allowable current and maximum allowable power. As a result, the power management method allows the device to execute more function threads than the device not using the power management method of the disclosure.

Figure 4:
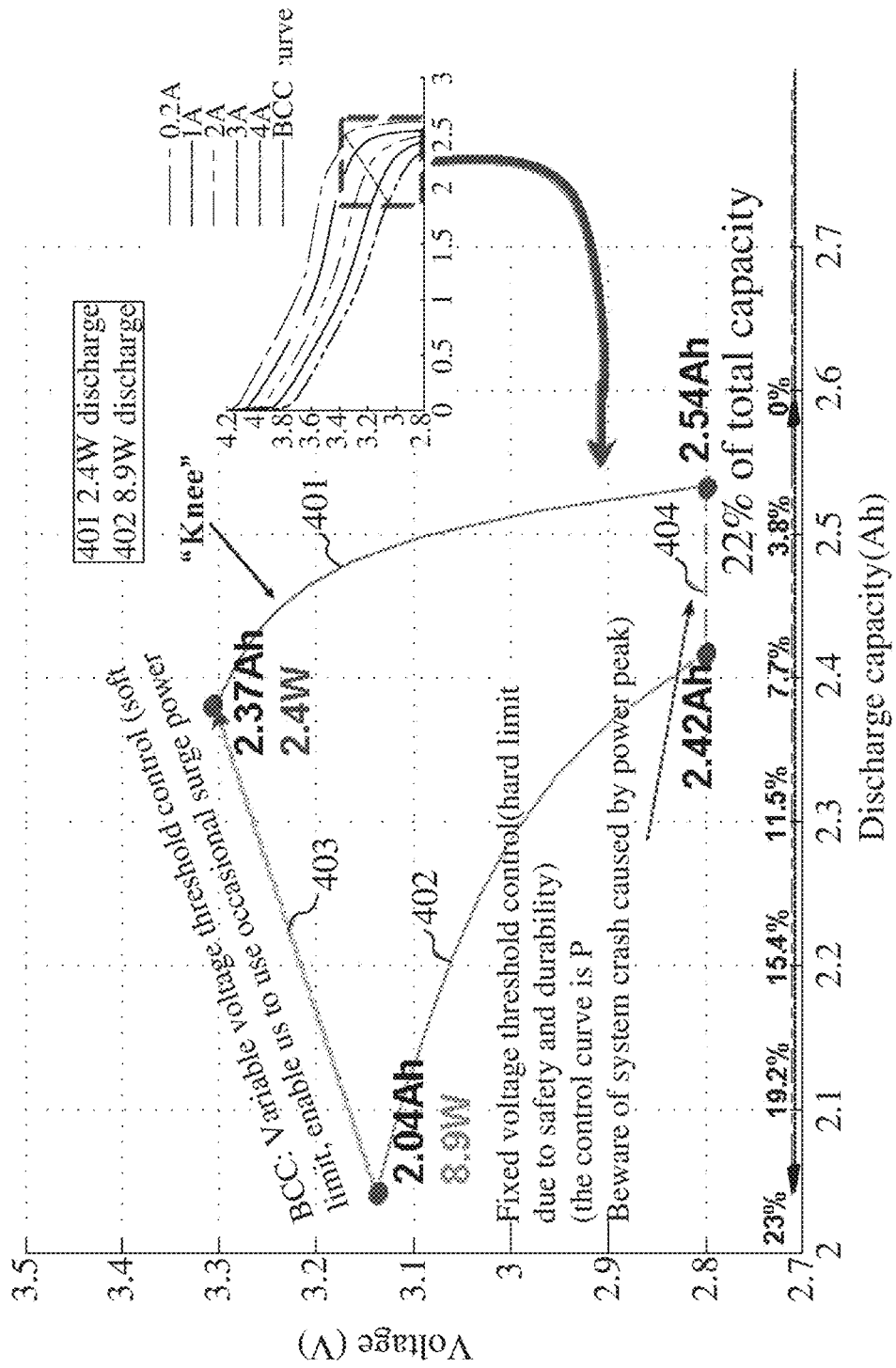
FIG. 4 shows characteristics of battery in low capacity state, according to one exemplary embodiment.

The power management method for electro-chemical batteries in low capacity state is based on the electro-chemical characteristics of the battery and electro-power distribution. As shown in FIG. 4, there are two constant power discharge curves (2.4 W discharge curve 401 and 8.9 W discharge curve 402). When the battery power of the device is nearly used up, the battery is controlled to discharge above the knee point along the BCC curve 403 in the V-Ah domain, wherein the knee point is defined as a point on the BCC curve where the derivative changes more abruptly than the adjacent points. The BCC curve can also be mapped to I-Ah or P-Ah domain, as shown in FIG. 9, which will be described later. The BCC may be used as the current budget (in I-Ah domain), or power budget (in P-Ah domain) for power modulation, to enable the device to execute important function threads with larger power consumption.

The BCC curve in the present power management method may be considered as an extension of the technique disclosed in U.S. Publication No. 2012/0133331, wherein the BCC curve is expressed in a voltage versus discharge capacity domain (V-Ah) originally. In the present disclosure, the BCC curve is extended to a current versus discharge capacity domain (I-Ah) and a power versus discharge capacity domain (P-Ah), which are easier to use by power management electronics. In other words, in the present disclosure, the BCC curve is expressed in a V-Ah domain, an I-Ah domain and a P-Ah domain. Through the I-Ah BCC or P-Ah BCC, the device can know in advance the maximum allowable current and maximum allowable power, both are state of charge (SoC) quantitative related. In comparison, the known technique is to fix the maximum allowable current/power at a selected value, or to decrease the current according to the battery operating temperature, while the present disclosure utilizes an equation to define the changes or decrease the current according to the battery operating temperature. The present disclosure uses an equation to define the changes of current/power with respect to SoC of the battery to obtain corresponding quantities for reference by the system and used in battery discharging control. During the battery discharging process so that, the device can automatically search and update the BCC curve. As a result, the power method management can avoid inappropriate shutdown of the system caused by power consumption surge and execute more function threads.

The following describes the theory behind the step of knowing the maximum allowable current and maximum allowable power in advance.

Figures 5A, 5B:
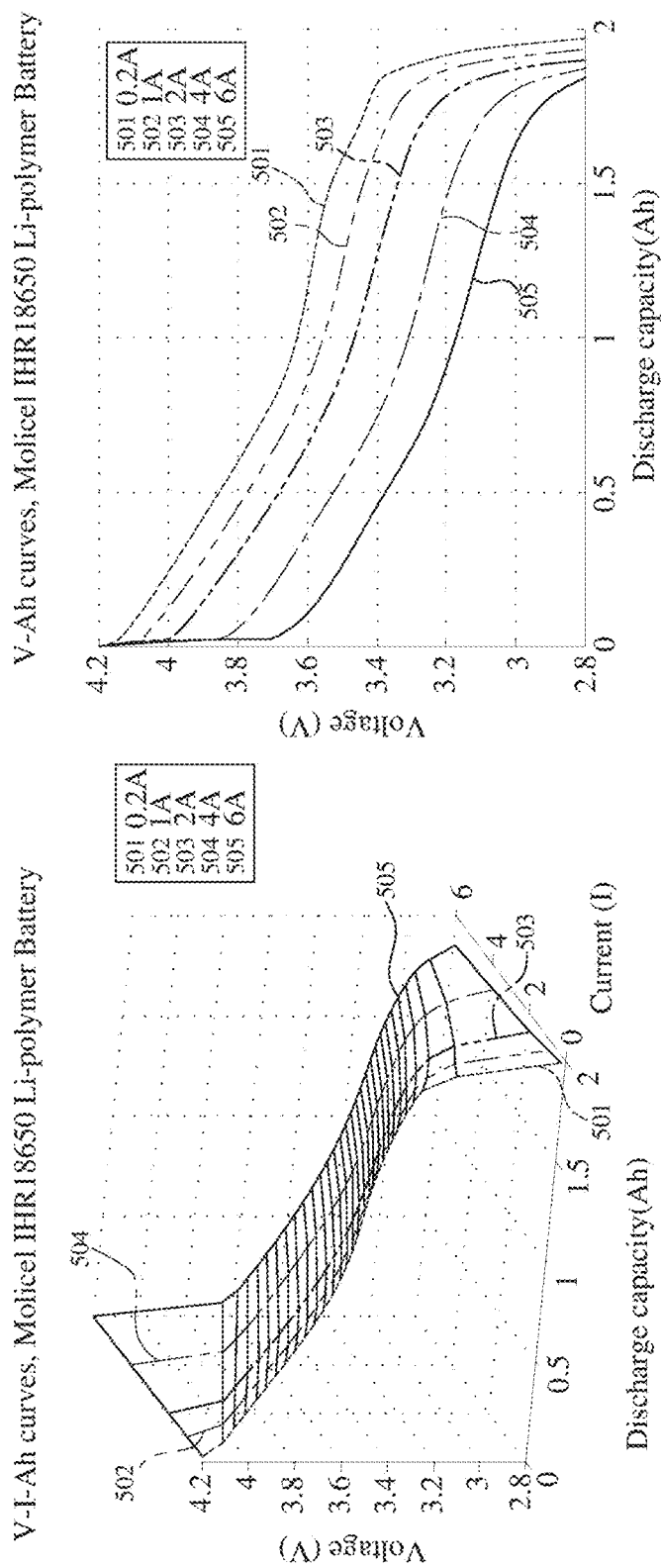
FIG. 5 shows a battery discharging curve model, wherein (a) V-I-Ah characteristics (b) V-Ah characteristics (c) P-I-Ah characteristics (d) P-Ah characteristics, according to one exemplary embodiment.
Figures 5C, 5D:
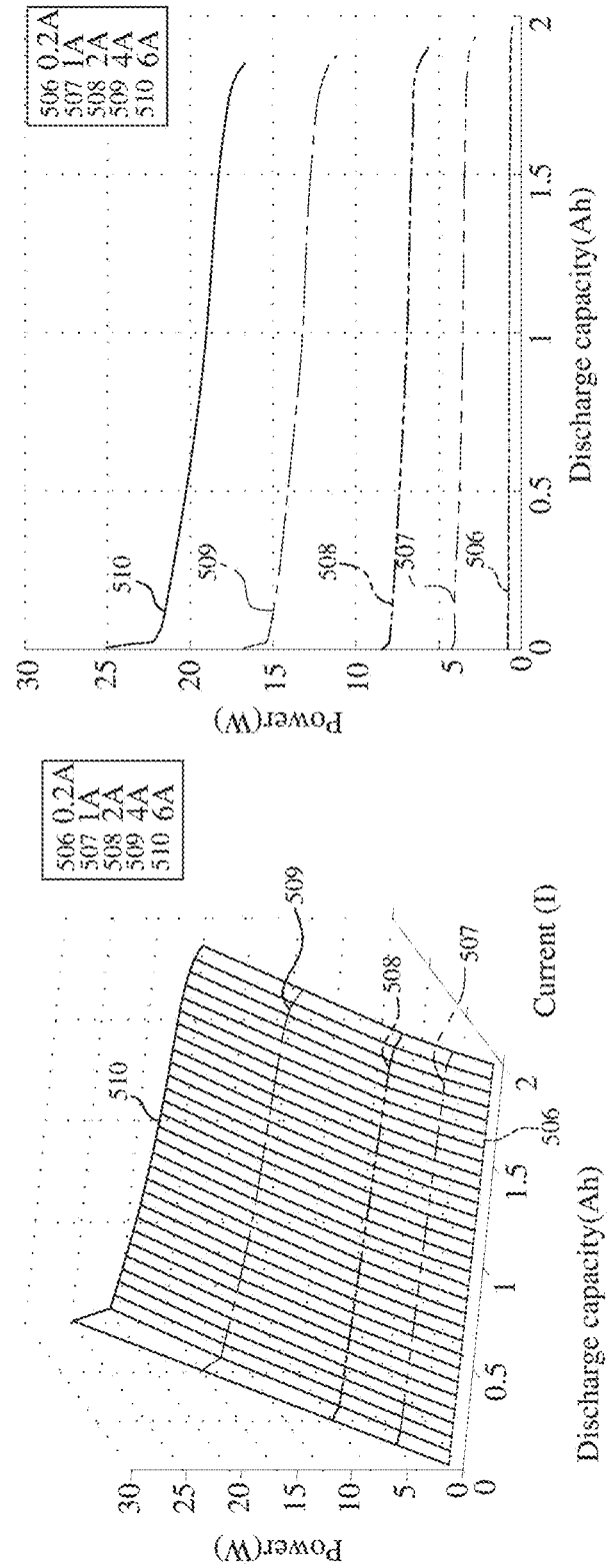

Different batteries show different discharging characteristics. FIG. 5 shows a schematic view of a battery discharging curve model formed by two or more different discharging curves. As shown in FIGS. 5(a) and 5(c), an interpolation function or other curve fitting methods, intelligent reasoning methods can be used to establish battery V-I-capacity(Ah) and P-I-capacity(Ah) surface model. The 3D model is then projected to the V-Ah (FIG. 5(b)), I-Ah, and Power-Ah (FIG. 5(d)) planes respectively, and the BCC curve can be expressed by a simple linear function. In the V-I-Ah surface model shown in FIGS. 5(a) and 5(b), there are five curves represent various discharge current in 0.2 A (curve 501), 1 A (curve 502), 2 A (curve 503), 4 A (curve 504), and 6 A (curve 505). Also in the P-I-Ah surface model, there are five curves represent various discharge current in 0.2 A (curve 506), 1 A (curve 507), 2 A (curve 508), 4 A (curve 509), and 6 A (curve 510).

Figure 6:
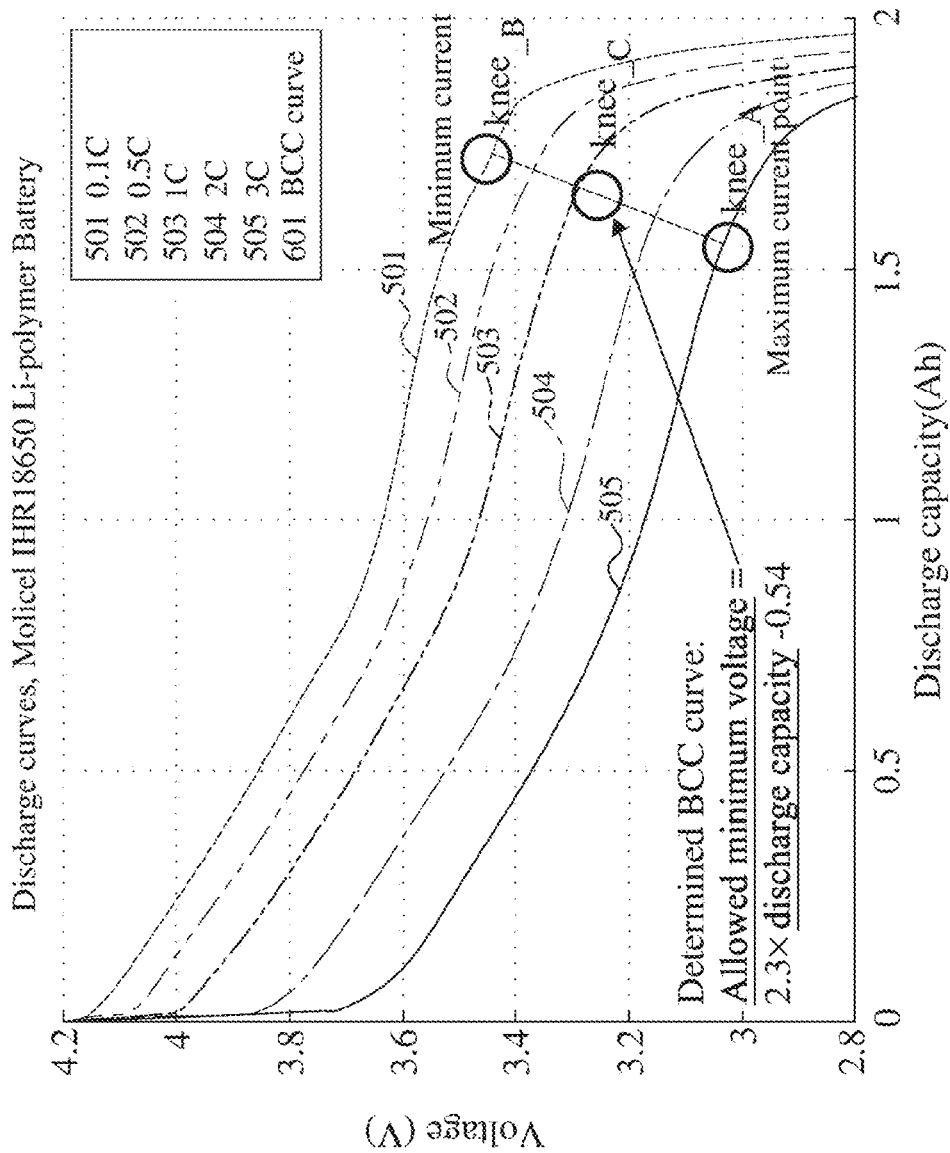
FIG. 6 shows a schematic view to determine BCC curve, according to one exemplary embodiment.
Figure 9C:
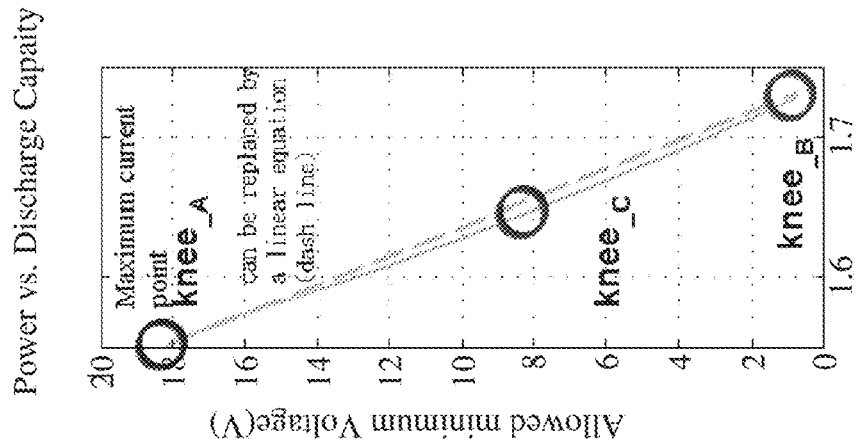
FIG. 9 shows a schematic view of BCC curve with V-Ah to obtain I-Ah and P-Ah, wherein (a) BCC curve in V-Ah domain (b) BCC curve in I-Ah domain (c) BCC curve in P-Ah domain, according to one exemplary embodiment.
Figure 9B:
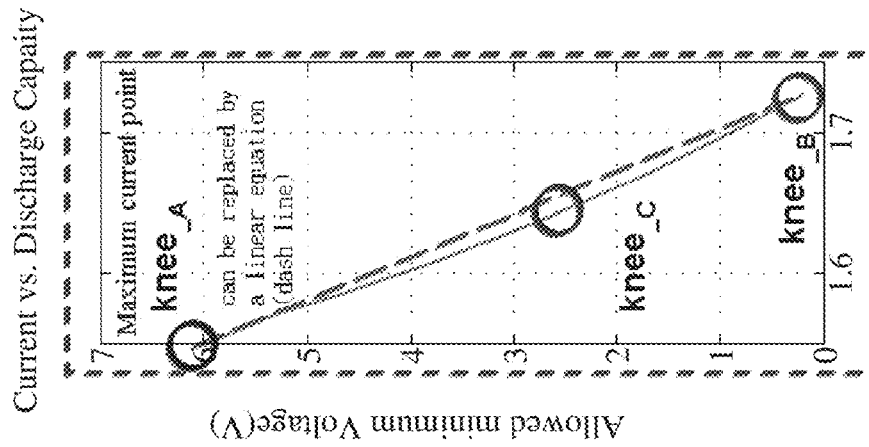
Figure 9A:
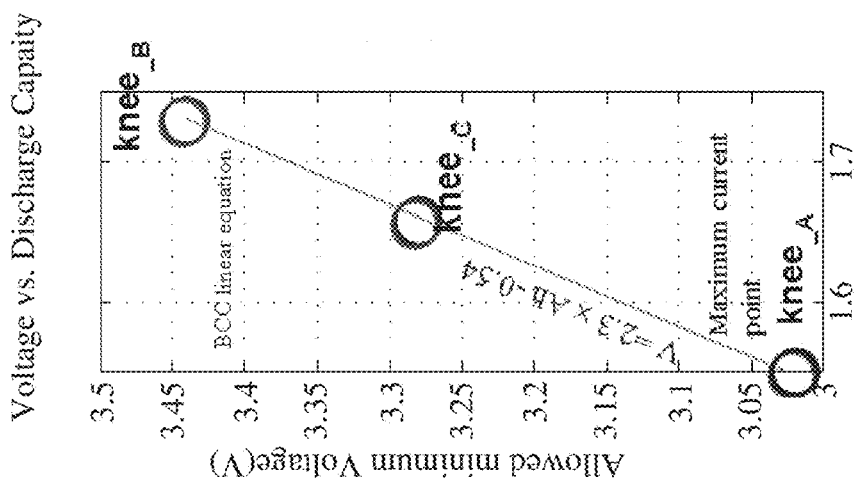

In V-Ah domain as shown in FIG. 6 and FIG. 9(a), the suggested soft-limit voltage curve described in U.S. Publication No. 2012/0133331 is:

$$V=f(Ah)=a_V*Ah+b_V$$

In I-Ah domain as shown in FIG. 9(b), the suggested soft-limit current curve defined by the present method as the current budget when the battery is low is:

$$I=f(Ah)=a_I*Ah+b_I$$

In P-Ah domain as shown in FIG. 9(c), the suggested soft-limit power curve defined by the present method as the power budget when the battery is low is:

$$P=f(Ah)=a_P*Ah+b_P$$

Therefore, the current and power of the battery under a specific capacity and specific voltage can be obtained through the above equations.

In step 302, the device will automatically search and update the BCC curve. The key to the automatic BCC curve updating is to search the corresponding knee points on the V-Ah curve, I-Ah curve and P-Ah curve. The general guideline for searching for the knee point is to find the point where the impedance, defined as $\Delta V/\Delta I$, abruptly increases relatively as the battery discharging capacity increases. The phenomenon can be observed through periodic checking of $\Delta V/\Delta I$.

The following uses an exemplary embodiment to describe the finding of the knee point. By reading the relative change ratio of the V and I on the V-I-Ah model, the two ends (i.e., maximum current and minimum current) of the BCC curve can be obtained when reaching limits. The results are reported to the device for effective use of battery capacity.

Then, a constant current discharging experiment, as suggested by U.S. Publication No. 2012/0133331, can be used to establish the relation between the voltage and capacity at different discharging rate, as shown in FIG. 6. The discharging rate is often denoted in C or C-rate and signifies a discharging rate equal to the capacity of a battery in one hour. For a 2 Ah battery with 0.1 C (0.2 A) discharging curve 501 shown in FIG. 6, the discharging time would be 10 hours from fully charge to empty state. The corresponding discharging time for discharging curve 502, 503, 504, and 505 would be two hours (0.5 C), one hour (1 C), 30 minutes (2 C), and 20 minutes (3 C). It should be noted that such relation information can also be found in various discharging curve database. However, the available database may not be applicable to the actual application. In addition, the curves may change as the battery ages. Also, within specific temperature range (such as, 25-30° C., or room temperature range for different climate zones), the measured real time information on the discharging curves for non-constant current can be used to establish database. The least number of the discharging curves is two. In other words, in the embodiment, a device needs to pass the low capacity region twice to allow the finding of the knee point.

The next is to automatically search for the boundary of non-linear region of the battery discharging process (the turning location of V-Ah in FIG. 6). In actual operation, the battery discharging is non-constant current (curve 702) resulting in voltage (curve 701) and power (curve 703) fluctuation, as in FIG. 7, and is more difficult to find the BCC curve. However, as shown in FIG. 8, the $\Delta V/\Delta I$ change ratio can be used to find the turning location. Use FIG. 8 as example, a $\Delta V/\Delta I$ in the lowest capacity region, such as, 30%±20% and a $\Delta V/\Delta I$ in the middle capacity region, such as, 50%±30% can be compared. For the point with $\Delta V/\Delta I$ higher than a threshold, such as, 10%, can be selected as a knee point. In FIG. 8, the threshold is defined as 30%.

Then, with the multiple of the selected $\Delta V/\Delta I$, the I-Ah BCC curve and P-Ah BCC curve can be configured, wherein the following parameters a and b can be obtained by the two turning locations of BCC curve. For example, in FIG. 6, knee$_A$ and knee$_B$ are selected. That is, parameter a can be obtained by the slope of the BCC line (curve 601) connecting knee$_A$ and knee$_B$, and parameter b can be computed subsequently:

Allowed minimum voltage=$a_V$×discharge capacity+$b_V$ (described in U.S. Publication No.US2012/0133331)

Current budget=$f_I$(discharge capacity)=$a_I$×discharge capacity+$b_I$

Power budget=$f_P$(discharge capacity)=$a_P$×discharge capacity+$b_P$

Then, configure the relation between the allowed discharging current and discharging capacity to obtain FIG. 9. The simplest approach is to connect the two corresponding values of two different currents with a straight line after selecting $\Delta V/\Delta I$:

current budget=$f_I$(discharge capacity)

An alternative is to connect the two corresponding values of two different currents with a straight line:

power budget=$f_P$(discharge capacity)

Figure 7:
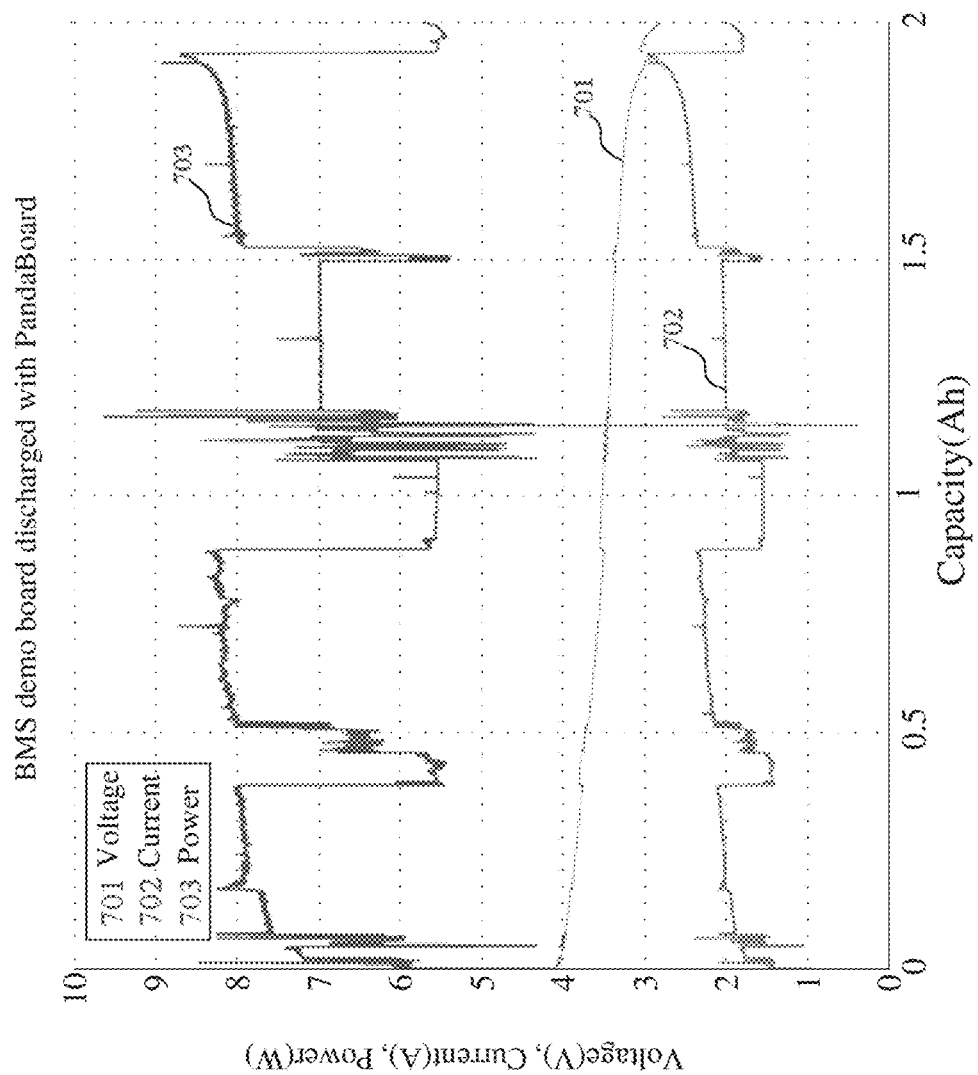
FIG. 7 shows a schematic view discharging V-I-Ah in an actual battery application, according to one exemplary embodiment.
Figure 8:
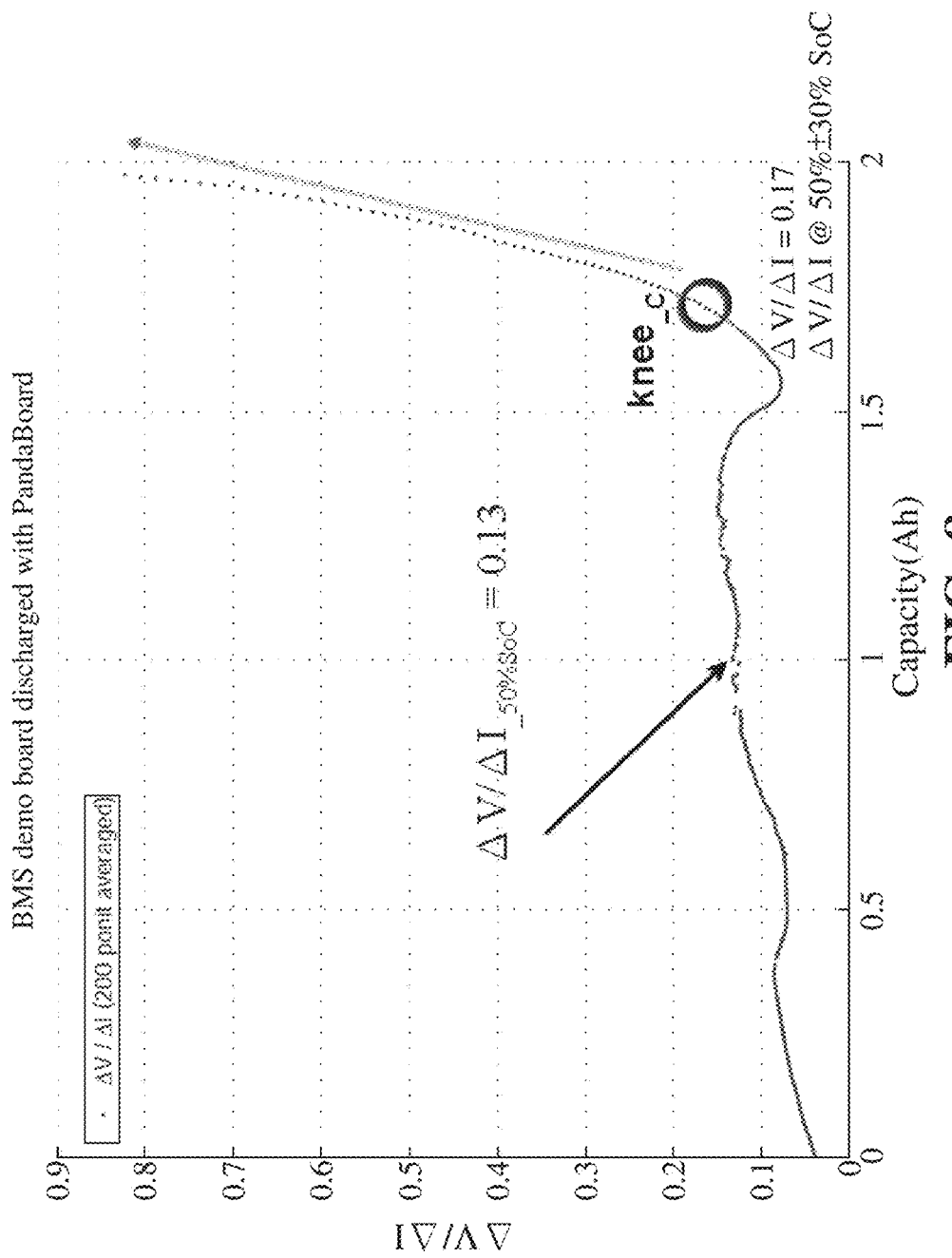
FIG. 8 shows a schematic view of determining BCC curve: by sampling $\Delta V/\Delta I$ change ratio, according to one exemplary embodiment.

Finally, through the battery discharging process (which can be non-constant power discharging) reaching the knee points, using FIG. 6, FIG. 7 and FIG. 9 as example, with the found knee$_{-A}$ and knee$_{-B}$, a new knee$_{-C}$ is found. The newly found knee$_{-C}$ is used as an update point. By connecting the new point and the previous found knee$_{-B}$, a new BCC curve is obtained.

Figure 10:
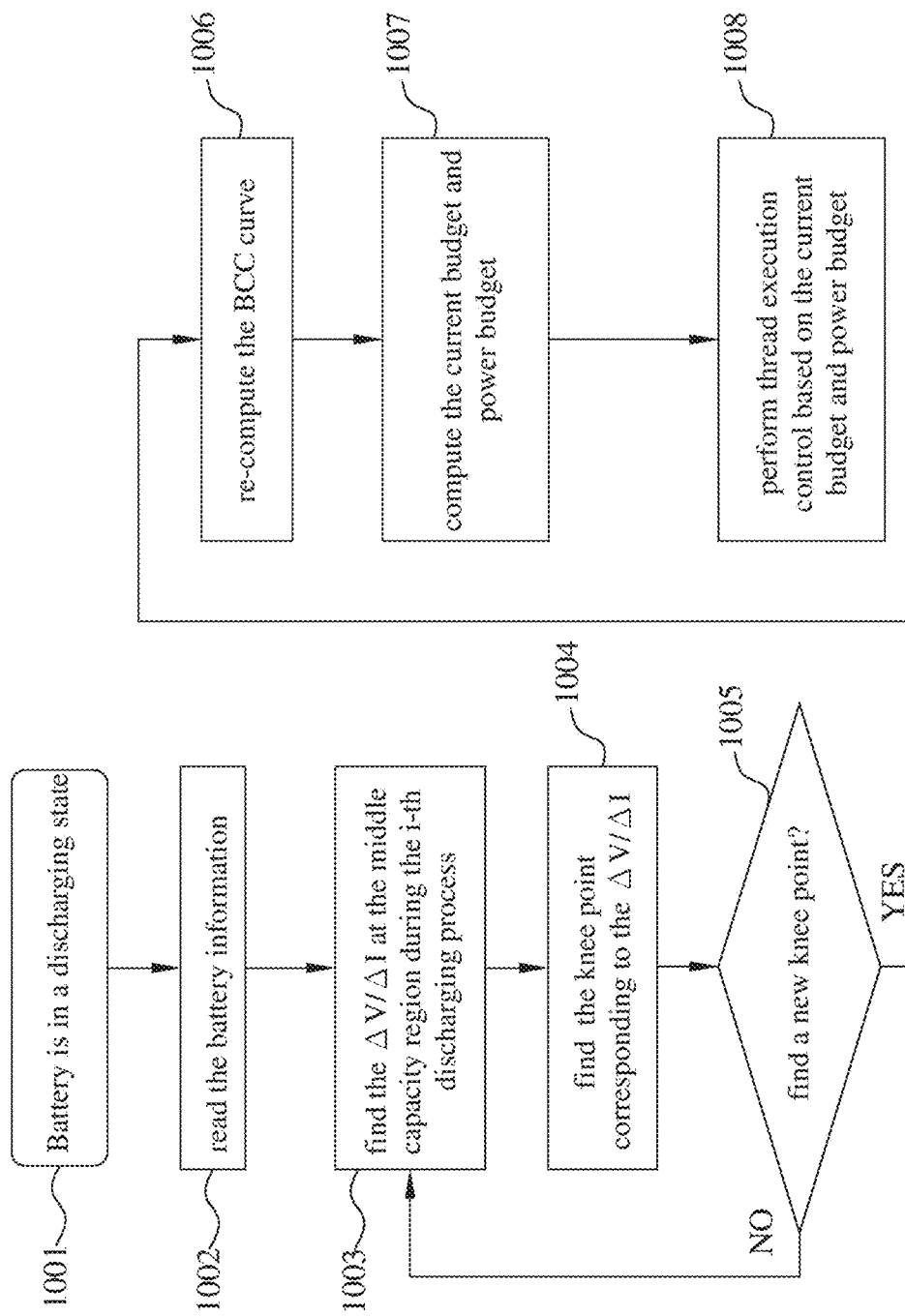
FIG. 10 shows a flowchart of the power management method with detailed updating the BCC curve step, according to one exemplary embodiment.

FIG. 10 shows a flowchart of the power management method with detailed updating the BCC curve step, according to one exemplary embodiment. When taking battery ageing into consideration and the corresponding $\Delta V/\Delta I$ values of a new battery and an old battery are compared at different SoC, the $\Delta V/\Delta I$ of the old battery will obviously increase at different SoC. Therefore, the comparison is made for during discharging and middle SoC region, and the extent of the $\Delta V/\Delta I$ increase is used as a reference threshold for finding the knee point. As shown in FIG. 10, step 1001 is that the battery is in a discharging state. Step 1002 is to read the battery information. Step 1003 is to find the $\Delta V/\Delta I$ at the middle capacity region during the i-th discharging process. Step 1004 is to find the knee point corresponding to the $\Delta V/\Delta I$. In step 1005, when a new knee point is found, proceed to step 1006; otherwise, return to step 1003. Step 1006 is to re-compute the BCC curve. Step 1007 is to compute current budget and power budget, and step 1008 is to perform function thread execution control based on the current budget and power budget.

It should be noted that in step 1002, the battery information includes voltage (V), current (I), discharge capacity, temperature, or the count of discharging process "i", etc. In step 1003, the middle capacity region can be selected, for example, as 50%±30%, and the corresponding $\Delta V/\Delta I$ is recorded. Observing $\Delta V/\Delta I$ during discharging and a multiple comparison is made with the $\Delta V/\Delta I$ selected in step 1003. When the comparison exceeds a threshold, for example, 10%, a knee$_{-i}$ is determined to be found in the i-th discharging process. In step 1006, the new BCC curve is established by connecting the new knee point with previous knee point knee$_{i-1}$ or even more previous knee points. In step 1007, a set of parameters, such as, voltage, current, power, discharge capacity, temperature, can be found from knee$_i$, and compared with the parameters from the knee point knee$_{i-1}$ of previous (i-1)th discharging process to form linear equations on the V-Ah, I-Ah and P-Ah planes. The lower bound of the voltage, upper bound of the current and upper bound of the power can be obtained from the equations.

Referring to FIG. 4, when analyzing the low capacity state of the battery to find the voltage threshold control mechanism for battery in low capacity state (i.e., BCC curve), the mechanism can be either (1) variable voltage threshold control line 403 or (2) fixed voltage threshold control line 404, wherein the variable voltage threshold control is the BCC curve, and the appropriate control curve can be found near the knee point in the V-Ah diagram. Use a battery with the minimum allowed voltage of 2.8V as an example. When the battery discharges following the control curve, the maximum allowable power is $P_{max\ allowable}$. Take the 3G phone call in FIG. 2 as example. The peak power, occasional surge power and offset power of other execution function threads are measured. A priority list is used to determine the control of the function threads to reduce the power consumption so that the released power from the terminated function threads can be used by the function threads with higher priority. Therefore, in step 1006 of FIG. 10, the device can allow stable operation even when the battery is in low capacity state. On the other hand, the user has more flexibility to manage the execution function threads through priority list of function thread execution.

With the power consumption load pattern for each function thread in the device as in FIG. 2, the V-Ah diagram of the battery in FIG. 6, the previously obtained BCC control data stored in storage of the device, and the battery information (voltage, current, capacity, temperature, and so on) measure during operating, the device can control the ON/OFF of the function threads to provide more convenience to the user when the battery becomes low, i.e., the limited power budget and limited current budget.

Figure 11:
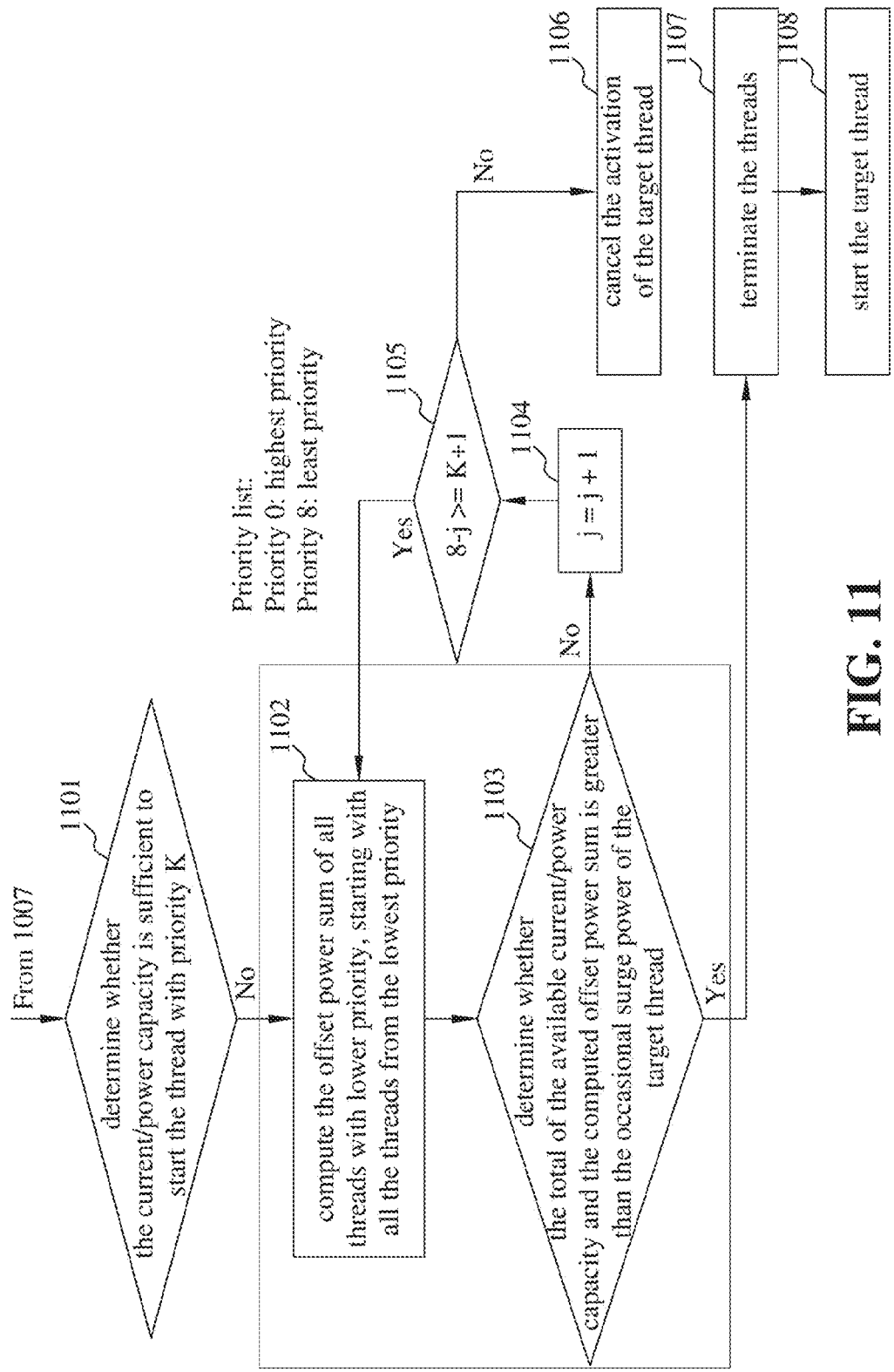
FIG. 11 shows a flowchart of the step of performing function thread execution control based on the current budget and power budget in details, according to one exemplary embodiment.

FIG. 11 shows a flowchart of the step 1008 in details. Take the execution of a function thread with priority (K)=3 as example. As shown in FIG. 11, step 1101 is to determine whether the current power capacity is sufficient to start the function thread with priority K (=3); when the capacity is sufficient, proceed to step 1108 to start the function thread; otherwise, proceed to step 1102. Step 1102 to step 1105 are to compute the sum of the offset power of all function threads with lower priority than K(=3), starting with function threads having the lowest priority. For example, if there are nine levels of priority, with 8 being the least priority, the sum of the offset power of the function threads with priority from 4 to 8 are computed. In step 1102, the offset power sum starts with all the function threads from the lowest priority, i.e., 8, to the selected (8-j) priority. In one embodiment, the initial value of parameter j is set as 0. Step 1103 is to determine whether the total of the available current/power capacity and the offset power sum computed in step 1102 is greater than the occasional surge power of the target function thread with K=3; when the total of the available current/power capacity and the offset power sum computed in step 1102 is greater than the occasional surge power of the target function thread with K=3, proceed to step 1107 to terminate the function threads in step 1102 and then start the target function thread, as in step 1108; otherwise, proceed to step 1104. Step 1104 is to include the function threads with next higher priority level (by increasing the iteration index by 1), and step 1105 is to determine whether the priority level reaches the priority level of the target function thread to be started. When the priority level is still lower than the priority level of the target function thread, return to step 1102; otherwise, proceed to step 1106 to cancel the activation of the target function thread as terminating all the function threads having lower priority than the target function thread cannot release sufficient power capacity for starting the target function thread.

An experiment shows that the power management method allows the device to activate more execution function threads, as following: when the battery discharges along BCC curve, the battery voltage is adjusted to a higher level as the battery capacity is lowered, while the current is decreased as the battery capacity is lowered. Inferably, a battery operated in such a manner has the advantage of the ability to tolerate the occurrence of peak power, especially when the battery is near the low capacity, whose concentration polarization causes the impedance to increase. Compared to the middle capacity region, a tiny current fluctuation will cause a large response in voltage. In other words, the $\Delta V/\Delta I$ will increase rapidly. The manner of increasing battery operating voltage (and lowering current) in low battery capacity provides the advantage that—occasional surge power is considered when deciding whether a function thread can be started, as opposed to the known technique to consider maximum peak power when deciding whether to start a function thread. As a result, the present disclosure is more robust for the system stability in comparison with the known technique.

System State: allowable power=2.5 W (based on previous BCC budget);

Power consumption table, as below:

TABLE

| | Peak power | Occasional surge power | Offset power | Priority |
|---|---|---|---|---|
| Function thread #0 (CPU freq.: 350 MHz) | 6.4 W | 5.7 W | Shutdown mode | 0 |

TABLE-continued

|  | Peak power | Occasional surge power | Offset power | Priority |
|---|---|---|---|---|
| Function thread #1 (LCD) | 5 W | 2.8 W | 2.2 W | 1 |
| Function thread #2 (3G) | 3.5 W | 1.8 W | 1 W | 2 |
| Function thread #3 (notes) | 2.5 W | 1.2 W | 0.8 W | 3 |
| Function thread #4 (CPU freq.: 700 MHz) | 6.8 W | 6.5 W | 0.8 W | 4 |
| Function thread #5 (CPU freq.: 920 MHz) | 7.7 W | 7.1 W | 0.5 W | 5 |
| Function thread #6 (CPU freq.: 1200 MHz) | 8.5 W | 7.5 W | 0.4 W | 6 |

System is running Function thread 2 and 3 currently and intends to start function thread 1.

Step 1102: compute the sum of lower priority (priority>=2) function threads. (1 W+0.8 W=1.8 W)

Step 1103: compare the total of 1.8 W (from step 1002) and 2.5 W against function thread 1 occasional surge power: 1.8 W+2.5 W>=Function thread 1 occasional surge power;

Step 1104 and step 1105: determine minimum number of low priority function threads to be terminated. In this case, function thread 3 needs to be terminated.

Step 1107: terminate function thread 3 (0.8 W power is released+2.5 W=3.3 W>2.8 W);

Step 1108: start function thread 1. (At this point, system allowable power=0.5 W).

To turn on function thread 3 again, the device goes through the above process again. However, function thread 3 cannot be started because of insufficient power budget. The final result will be function thread 1 and function thread 2 running.

In comparison, in the known power management methods that only consider maximum peak power, when the system power remains 2.5 W left, Function thread 1 cannot be started by closing Function thread 2 and 3 to create maximum 1 W+0.8 W extra power allocation.

Figure 12:
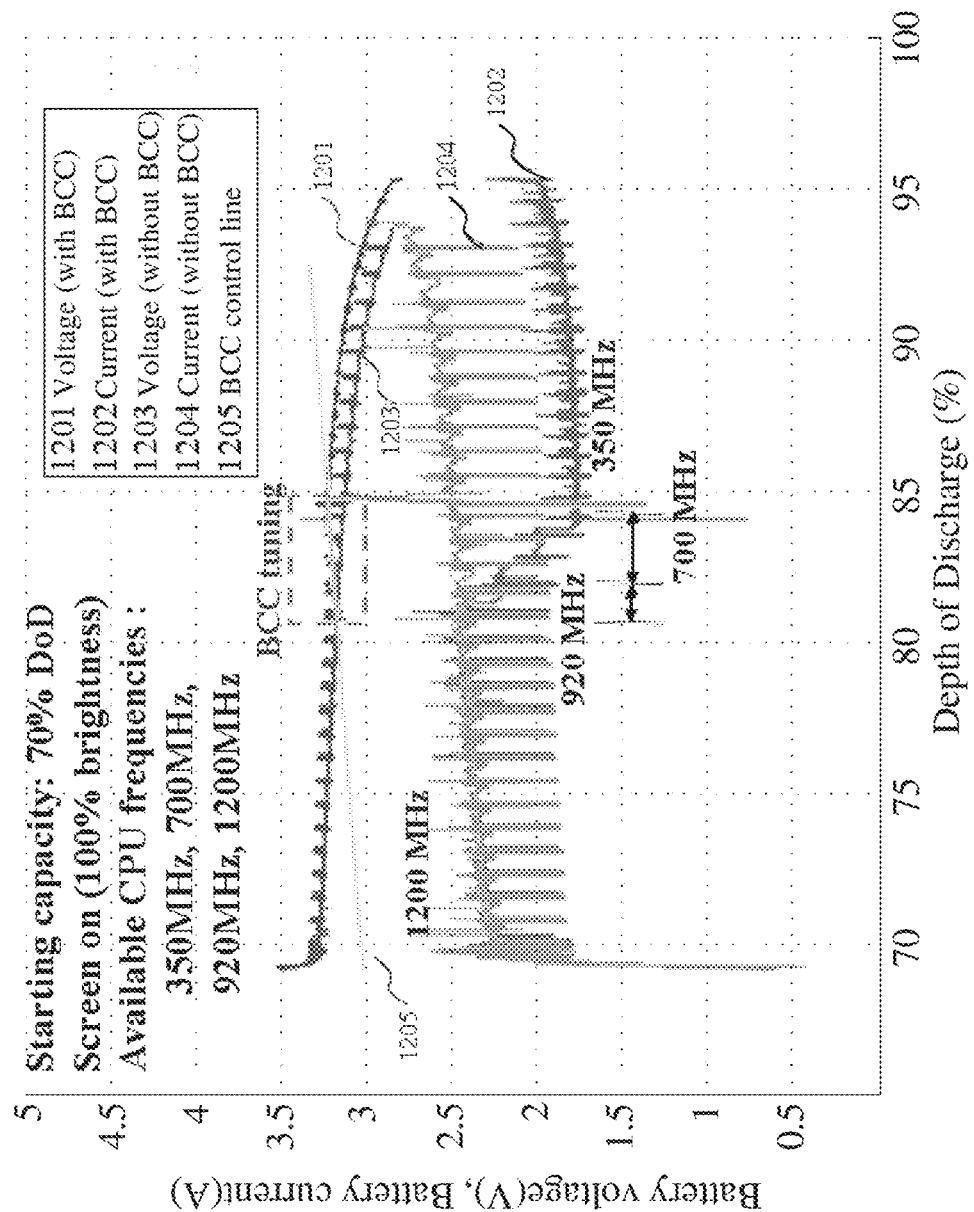
FIG. 12 shows a schematic view of results of CPU frequency tuning based on BCC curve, according to one exemplary embodiment.
Figure 13:
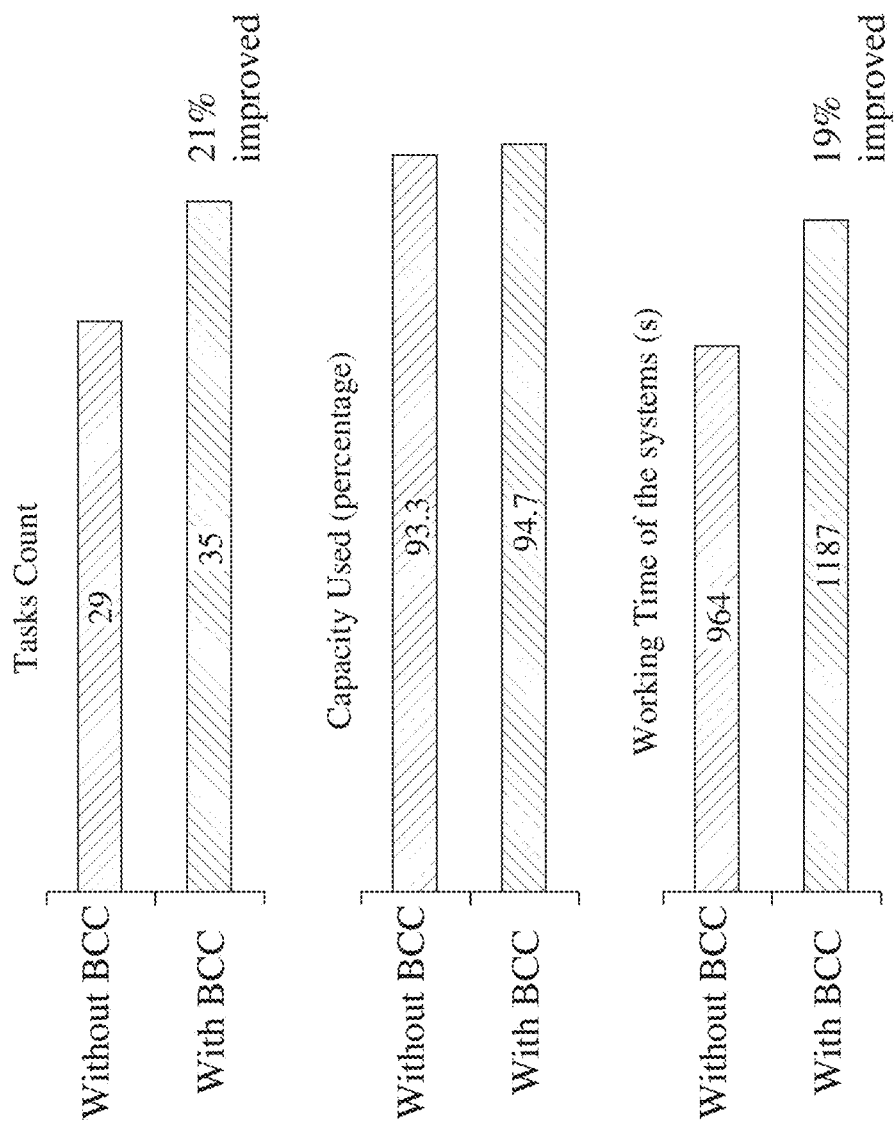
FIG. 13 shows a schematic view of performance of CPU frequency tuning based on BCC curve, according to one exemplary embodiment.

Furthermore, the CPU operating frequency can also adjusted based on BCC power budget. As shown in FIG. 12, by using the known BCC curve 1205, as the discharging capacity increases, the current and the voltage are reduced. The hardware mechanism for reduction is the CPU operating frequency, 1200 MHz, 920 MHz, 700 MHz, and 350 MHz, as shown in the above Table 1. These four frequencies can be viewed as different function threads, with the highest frequency 1200 MHz having the lowest priority, and the lowest frequency 350 MHz having the highest priority. The CPU operating at a lower frequency consumes less power. When the BCC-controlled current (curve 1202) and voltage (curve 1201) of the battery are higher than the system power consumption level at the current time, the device starts to terminate the frequency setting with the lowest priority and the CPU operating frequency is tuned to a lower frequency. In other words, the highest operating frequency of the CPU is restricted. When the battery is not controlled by BCC, the voltage (curve 1203) and current (curve 1204) behaviors cause the system do more less work than the BCC controlled scenario. The following test shows results from a device with BCC-controlled budget power modulation and a device without, as shown in FIG. 13. Because CPU clocks are in discrete steps, the power consumption modulation may only initially and roughly follow BCC power budget. Even with the limited modulation in this case, the device with BCC-controlled budget power modulation for execution function threads (as shown in FIG. 11) may extend near 20% in both usage time and number of execution function threads when the system is in the last 30% of power capacity.

Because BCC-control power budget modulation is a soft-limit, deviation from the curve will not cause the BMS module to cut off the battery power abruptly.

The exemplary embodiments have following features: (1) when the battery is in low capacity state and unable to provide sufficient output power, the method allows the device to compute the maximum allowable power consumption, and using the priority, peak power, occasional surge power and offset power of the function threads, to determine whether a new function thread can be started or running function threads should be terminated; (2) the maximum allowable output estimated by the present method could quantify the maximum allowable power consumption by the battery in low capacity state, and the device could utilize the remaining power in the battery through controlling the function thread execution; and (3) applicable to any devices driven by batteries.

According to another one of the embodiments of the present disclosure, there is provided a non-transitory computer readable recording medium for storing one or more programs, the one or more programs causing a processing unit to perform the methods described herein.

According to another one of the embodiments of the present disclosure, there is provided an apparatus for power management, comprising a processing unit, and memory. The processing unit is configured to perform the steps described in the above embodiments.

According to another one of the embodiments of the present disclosure, there is provided a chip for power management, comprising one or more integrated circuits, the one or more integrated circuits being configured to process the function described in the above embodiments.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A power management method, applicable to electrochemical batteries of an electronic device in a low capacity state of a discharging process, the electronic device able to run a plurality of function threads, at least one electro-chemical battery having a minimum battery capacity, comprising:
    obtaining a plurality of battery information, the plurality of battery information comprising at least a maximum allowable current and a maximum allowable power when the at least one electro-chemical battery a in the low capacity state;
    updating a battery characteristic curve (BCC) by detecting changes in voltage versus current;
    using the BCC curve to determine whether any function thread of a plurality of function threads are eligible for termination and controlling to terminate or continue the plurality of function threads running on the electronic device; and
    when reaching the minimum battery capacity and no function thread has been determined eligible for termination, turning off the at least one electro-chemical battery; otherwise, returning to the step of obtaining the plurality of battery information.

2. The method as claimed in claim 1, wherein the power consumption of each of the plurality of function threads is expressed with a function thread peak power, for a highest power usage during executing the function thread, at least one occasional surge power, for a plurality of occasional peaks during executing the function thread execution, and an offset power, referring to the power offset when the function thread being terminated.

3. The method as claimed in claim 1, wherein the BCC curve is expressed in a voltage versus discharge capacity domain, a current versus discharge capacity domain and a power versus discharge capacity domain.

4. The method as claimed in claim 1, wherein each of the plurality of function threads has a priority, and the method terminates a running function thread with a lower priority to release power for starting a function thread with a higher priority.

5. The method as claimed in claim 1, wherein the step of using the BCC curve to determine whether any function thread of the plurality of function threads being eligible for termination and controlling to terminate or continue the plurality of function threads running on the electronic device further comprises:
- determining whether a current power capacity being sufficient to start a first function thread with a priority; when the current power capacity being sufficient, starting the first function thread; otherwise, searching for a second function thread with lower priority than the first function thread and terminating the second function thread to release power; and
- repeating the above step until the current power capacity being sufficient to start the first function thread, or all function threads with priority lower than the first function thread being terminated.

6. The method as claimed in claim 1, wherein the detecting changes in voltage versus current in the step of updating the battery characteristic curve (BCC) further comprises finding a knee point, wherein the finding the knee point further comprises:
- finding the changes in voltage versus current at a middle capacity region during the discharging process; and
- finding a point corresponding to the changes in voltage versus current exceeding a threshold, wherein the point becoming a currently found knee point.

7. The method as claimed in claim 6, wherein the middle capacity region is between 20%-80% of a state of charge of battery.

8. The method as claimed in claim 6, wherein the threshold is at least 10%.

9. The method as claimed in claim 6, wherein the currently found knee point is connected to a previously found knee point to update the BCC curve for subsequently controlling the plurality of function threads.

10. The method as claimed in claim 9, wherein a budget for current is determined based on the BCC curve connecting the currently found knee point connected to the previously found knee point.

11. The method as claimed in claim 9, wherein a budget for power is determined based on the BCC curve connecting the currently found knee point connected to the previously found knee point.

12. A non-transitory computer readable recording medium for storing one or more programs, the one or more programs causing a processing unit to perform:
- obtaining a plurality of battery information of at least one electro-chemical battery, the plurality of battery information comprising at least a maximum allowable current and a maximum allowable power when the at least one battery is in a low capacity state;
- updating a battery characteristic curve (BCC) by detecting changes in voltage versus current;
- using the BCC curve to determine whether any function thread of a plurality of function threads are eligible for termination and controlling to terminate or continue the plurality of function threads running on an electronic device; and
- when reaching the minimum battery capacity and no function thread has been determined eligible for termination, turning off the at least one electro-chemical battery; otherwise, returning to the step of obtaining the plurality of battery information.

13. An apparatus for power management, comprising a processing unit and a memory, the processing unit being configured to perform:
- obtaining a plurality of battery information of at least one electro-chemical battery, the plurality of battery information comprising at least a maximum allowable current and a maximum allowable power when the at least one battery a in a low capacity state;
- updating a battery characteristic curve (BCC) by detecting changes in voltage versus current;
- using the BCC curve to determine whether any function thread of a plurality of function threads are eligible for termination and controlling to terminate or continue the plurality of function threads running on an electronic device; and
- when reaching the minimum battery capacity and no function thread has been determined eligible for termination, turning off the at least one electro-chemical battery; otherwise, returning to the step of obtaining the plurality of battery information.

14. A chip for power management, comprising one or more integrated circuits, the one or more integrated circuits being configured to process:
- obtaining a plurality of battery information of at least one electro-chemical battery, the plurality of battery information comprising at least a maximum allowable current and a maximum allowable power when the at least one battery is in a low capacity state;
- updating a battery characteristic curve (BCC) by detecting changes in voltage versus current;
- using the BCC curve to determine whether any function thread of a plurality of function threads are eligible for termination and controlling to terminate or continue the plurality of function threads running on an electronic device; and
- when reaching the minimum battery capacity and no function thread has been determined eligible for termination, turning off the at least one electro-chemical battery; otherwise, returning to the step of obtaining the plurality of battery information.

\* \* \* \* \*